US008599118B2

(12) United States Patent
Cok

(10) Patent No.: US 8,599,118 B2
(45) Date of Patent: Dec. 3, 2013

(54) CHIPLET DISPLAY WITH ELECTRODE CONNECTORS

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 301 days.

(21) Appl. No.: 13/028,685

(22) Filed: Feb. 16, 2011

(65) Prior Publication Data
US 2012/0206428 A1  Aug. 16, 2012

(51) Int. Cl.
G09G 3/30 (2006.01)
(52) U.S. Cl.
USPC .............. 345/80; 313/484; 313/498; 315/168
(58) Field of Classification Search
USPC .......................... 345/205–206; 313/503–504; 315/169.1–169.3
See application file for complete search history.

(56) References Cited

U.S. PATENT DOCUMENTS

| 4,769,292 | A | 9/1988 | Tang et al. |
| 5,061,569 | A | 10/1991 | VanSlyke et al. |
| 6,320,571 | B1* | 11/2001 | Takahashi et al. ............ 345/204 |
| 6,384,529 | B2 | 5/2002 | Tang et al. |
| 6,496,168 | B1* | 12/2002 | Tomida ............................ 345/76 |
| 6,504,520 | B1* | 1/2003 | Osada et al. ..................... 345/76 |
| 6,816,140 | B2* | 11/2004 | Fujieda ............................. 345/87 |
| 6,879,098 | B2 | 4/2005 | Buchwalter et al. |
| 6,919,681 | B2 | 7/2005 | Cok et al. |
| 6,930,448 | B2 | 8/2005 | Kim |
| 6,987,355 | B2 | 1/2006 | Cok |
| 7,053,548 | B2 | 5/2006 | Nakanishi |
| 7,057,340 | B2 | 6/2006 | Imura |
| 7,230,594 | B2* | 6/2007 | Miller et al. .................... 345/82 |
| 7,262,556 | B2 | 8/2007 | Osame et al. |
| 7,301,168 | B2 | 11/2007 | Rhee et al. |
| 7,309,959 | B2 | 12/2007 | Nakanishi |
| 7,432,885 | B2 | 10/2008 | Asano et al. |
| 7,446,338 | B2 | 11/2008 | Shirasaki et al. |
| 7,557,367 | B2 | 7/2009 | Rogers et al. |
| 7,622,367 | B1 | 11/2009 | Nuzzo et al. |
| 2002/0127857 | A1* | 9/2002 | Ohgami et al. ............... 438/689 |
| 2004/0032637 | A1 | 2/2004 | Imamura |
| 2005/0017247 | A1 | 1/2005 | Koo et al. |
| 2005/0236979 | A1 | 10/2005 | Kwak et al. |
| 2006/0055864 | A1 | 3/2006 | Matsumura et al. |
| 2007/0032089 | A1 | 2/2007 | Nuzzo et al. |
| 2007/0057263 | A1 | 3/2007 | Kahen |
| 2007/0138946 | A1 | 6/2007 | Cok |
| 2007/0246707 | A1* | 10/2007 | Deng et al. ....................... 257/57 |

(Continued)

FOREIGN PATENT DOCUMENTS

| EP | 1437703 A1 | 7/2004 |
| JP | 2000-235891 | 8/2000 |
| WO | 2008/026573 A1 | 3/2008 |
| WO | WO 2010-046638 | 4/2010 |

Primary Examiner — Amare Mengistu
Assistant Examiner — Vinh Lam
(74) Attorney, Agent, or Firm — Global OLED Technology LLC

(57) ABSTRACT

A display device comprising a transparent substrate, transparent electrodes, light-emitting layers, and reflective electrodes that define light-emitting pixels in which chiplets with pixel driving circuits are connected to pixel connection pads that are connected to the transparent electrode by an opaque electrode connector such that at least a portion of one opaque electrode connector overlaps at least a portion of a transparent electrode to which the opaque electrode connector is not electrically connected. The device provides a display having improved pixel-driving performance and increased light-emitting area.

20 Claims, 8 Drawing Sheets

(56) References Cited

U.S. PATENT DOCUMENTS

| | | | |
|---|---|---|---|
| 2009/0115321 A1* | 5/2009 | Hayashi | 313/504 |
| 2009/0199960 A1 | 8/2009 | Nuzzo et al. | |
| 2010/0123268 A1 | 5/2010 | Menard | |
| 2010/0201253 A1 | 8/2010 | Cok et al. | |
| 2010/0207849 A1 | 8/2010 | Cok et al. | |

* cited by examiner

CHIPLET DISPLAY WITH ELECTRODE CONNECTORS

CROSS REFERENCE TO RELATED APPLICATIONS

Reference is made to commonly-assigned, co-pending U.S. patent application Ser. No. 12/191,478, filed Aug. 14, 2008, entitled "OLED device with embedded chip driving" by Winters et al., commonly-assigned, co-pending U.S. patent application Ser. No. 12/191,462, filed Aug. 14, 2008, entitled "DISPLAY DEVICE WITH CHIPLETS" by Cok et al., commonly-assigned, co-filed U.S. patent application Ser. No. 12/272,043, filed Nov. 17, 2008 entitled "DISPLAY DEVICE WITH CHIPLETS AND HYBRID DRIVE" by Cok et al., commonly assigned, co-pending U.S. patent application Ser. No. 11/311,763, filed Dec. 19, 2005 entitled "OLED DEVICE HAVING IMPROVED POWER DISTRIBUTION' by Cok; and commonly assigned co-pending U.S. patent application Ser. No. 12/369,163, filed Feb. 11, 2009, entitled "DISPLAY DEVICE WITH CHIPLETS AND LIGHT SHIELDS" by Cok et al.; the disclosures of which are incorporated by reference herein.

FIELD OF THE INVENTION

The present invention relates to display devices having a substrate with distributed, independent chiplets for controlling a pixel array and, more particularly, to the arrangement of electrodes and connecting signal buss wires.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. As used herein, pixels and sub-pixels are not distinguished and refer to a single light-emitting element. A variety of flat-panel display technologies are known, for example plasma displays, liquid crystal displays, and light-emitting diode (LED) displays.

Light emitting diodes (LEDs) incorporating thin films of light-emitting materials forming light-emitting elements have many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can comprise a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 entitled, "Stacked OLED Display having Improved Efficiency" by Cok. It is also known to employ a white sub-pixel that does not include a color filter, for example, as taught in U.S. Pat. No. 6,919,681 entitled, "Color OLED Display with Improved Power Efficiency" by Cok et al. A design employing an unpatterned white emitter has been proposed together with a four-color pixel comprising red, green, and blue color filters and sub-pixels and an unfiltered white sub-pixel to improve the efficiency of the device (see, e.g. U.S. Pat. No. 7,230,594 issued Jun. 12, 2007 to Miller, et al).

Two different methods for controlling the pixels in a flat-panel display device are generally known: active-matrix control and passive-matrix control. In a passive-matrix device, the substrate does not include any active electronic elements (e.g. transistors). An array of row electrodes and an orthogonal array of column electrodes in a separate layer are formed over the substrate with light-emitting material formed between the row and column electrodes; the overlapping intersections between the row and column electrodes form the electrodes of a light-emitting diode. External driver chips then sequentially supply current to each row (or column) while the orthogonal column (or row) supplies a suitable voltage to illuminate each light-emitting diode in the row (or column). Therefore, a passive-matrix design employs 2n connections to produce $n^2$ separately controllable light-emitting elements. However, only n light-emitting elements can be activated with different currents at once. A passive-matrix drive device is also limited in the number of rows (or columns) that can be included in the device since the sequential nature of the row (or column) driving creates flicker. If too many rows are included, the flicker can become perceptible. Moreover, the currents necessary to drive an entire row (or column) in a display can be problematic since the power required for the non-imaging pre-charge and discharge steps of PM driving become dominant as the area of the PM display grows. These problems limit the physical size of a passive-matrix display.

In an active-matrix device, active control elements are formed of thin films of semiconductor material, for example amorphous or poly-crystalline silicon, coated over the flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the luminance of the sub-pixel. Each light-emitting element typically employs an independent control electrode and an electrode electrically connected in common. Control of the light-emitting elements is typically provided through a data signal line, a select signal line, a power connection and a ground connection. Active-matrix elements are not necessarily limited to displays and can be distributed over a substrate and employed in other applications requiring spatially distributed control. The same number of external control lines (except for power and ground) can be employed in an active-matrix device as in a passive-matrix device. However, in an active-matrix device, each light-emitting element has a separate driving connection from a control circuit and is active even when not selected for data deposition so that flicker is eliminated.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials. In such active-matrix designs, each light-emitting element requires a separate connection to a driving circuit.

Employing an alternative control technique, Matsumura et al describe crystalline silicon substrates used for driving LCD displays in U.S. Patent Application 2006/0055864. The application describes a method for selectively transferring and affixing pixel-control devices made from first semiconductor substrates onto a second planar display substrate. Wiring interconnections within the pixel-control device and connections from busses and control electrodes to the pixel-control device are shown.

When employing an active-matrix control method for bottom—emitter light-emitting diode displays, the emissive area over the substrate is limited by the area required for the thin-film components or the crystalline silicon substrates. It is preferred, however, to make the emissive area as large as possible, since the emissive area, especially for OLED devices, can limit display lifetime.

Since thin-film components, crystalline silicon substrates, and photo-lithographically formed control, power, and ground wires typically comprise opaque metal, such as aluminum, traditional display layout designs for bottom-emitter displays arrange the wires and thin-film components between the emissive areas so that emitted light is not obscured by the wires and thin-film components, which can otherwise absorb light and reduce device efficiency. There are many examples of such design layouts in the prior art, for example U.S. Pat. No. 6,930,448, U.S. Pat. No. 7,262,556, U.S. Pat. No. 7,301,168, U.S. Pat. No. 7,446,338, and U.S. Patent Application 20050236979. U.S. Patent Application 20070138946 describes an electrically conductive buss formed in a layer opposite a transparent electrode. In these designs, the emissive area is limited by wires or thin-film components formed over the substrate, thereby reducing the lifetime of organic LED displays.

WO2010046638 discloses an active-matrix display using chiplets to form a logical chain.

There is a need therefore, for a display device having higher-performance pixel drivers with increased light-emitting area.

SUMMARY OF THE INVENTION

A display device comprises:
a) a transparent substrate having a display area;
b) a plurality of transparent electrodes formed over the transparent substrate in the display area, one or more light-emitting layers formed over the transparent electrodes, and one or more reflective electrodes formed over the one or more light-emitting layers, the overlap between the plurality of transparent electrodes and the one or more reflective electrodes defining a corresponding plurality of light-emitting pixels;
c) one or more chiplets including pixel driving circuits connected to pixel connection pads, each pixel connection pad electrically connected to a transparent electrode by an electrically conductive opaque electrode connector, the pixel driving circuits providing current through the connection pads and the electrically conductive opaque electrode connectors to the transparent electrodes to drive the pixels to emit light; and
d) wherein the opaque electrode connectors are formed over the transparent substrate in the display area and the transparent electrodes are formed over, and separated from, the opaque electrode connectors by a transparent insulator and wherein at least a portion of one opaque electrode connector overlaps at least a portion of a transparent electrode to which the opaque electrode connector is not electrically connected.

ADVANTAGES

The present invention provides a display having improved pixel-driving performance and increased light-emitting area.

Figure 1:
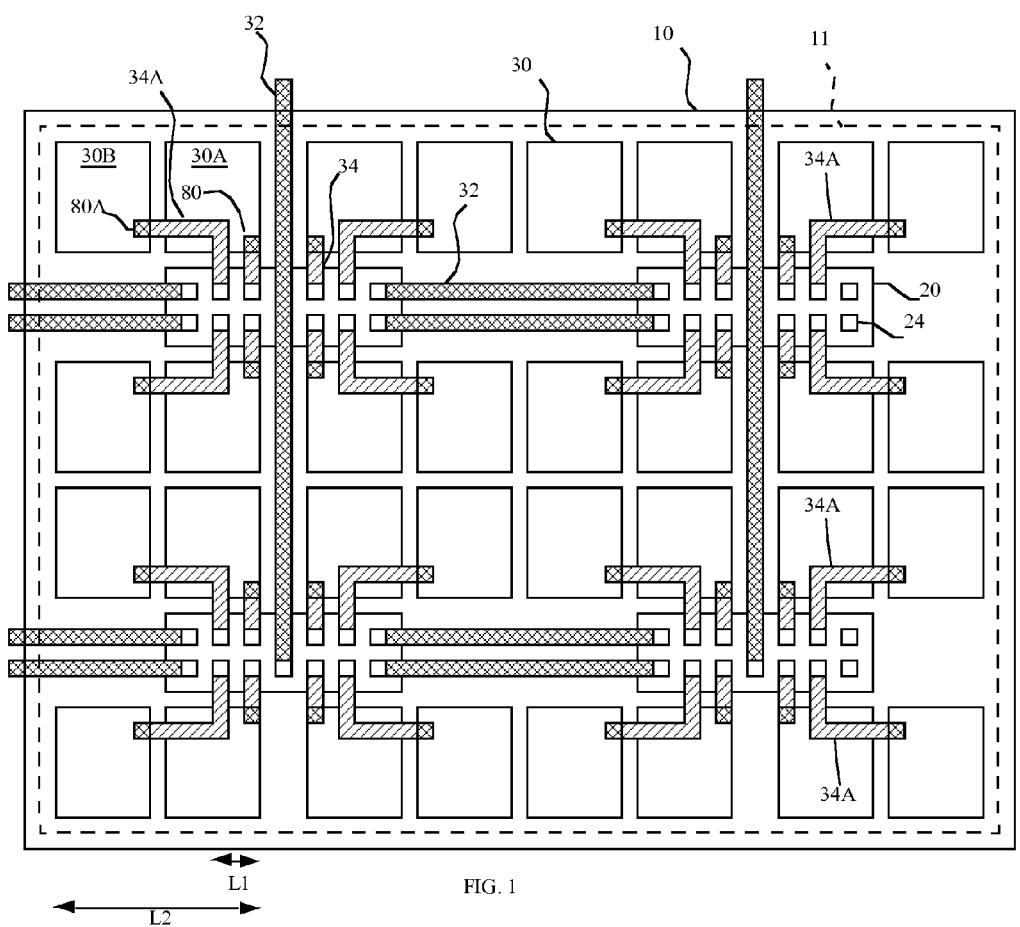
FIG. 1 is a plan view of a display device employing chiplets according to an embodiment of the present invention.

Because the various layers and elements in the drawings have greatly different sizes, the drawings are not to scale.

DETAILED DESCRIPTION OF THE INVENTION

Figure 9:
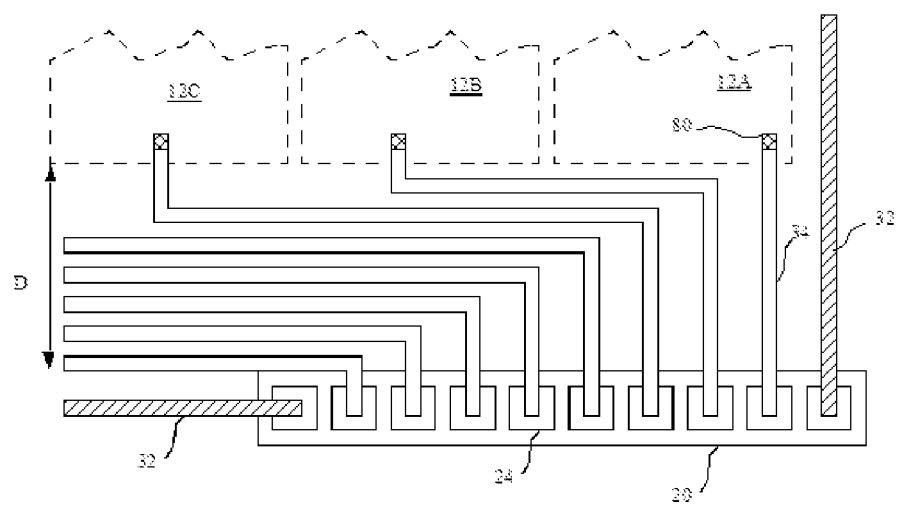
FIG. 9 is a plan view of a portion of a display device employing a chiplet and employing routed electrical connectors in a design suggested by the prior art.

The present invention provides higher-performance pixel-driving circuits for driving pixels in an emissive display with increased light-emitting area. The higher-performance pixel-driving circuits are formed in chiplets having crystalline silicon substrates separate from the display substrate. Transistors formed in the crystalline silicon substrates are smaller and have higher performance than conventional thin-film transistors found in prior-art active-matrix displays. Because the transistors are smaller and located within chiplets, electrical connections from the pixel-driving circuitry to pixel electrodes are necessary and are more concentrated in a smaller area than the vias typically used in a TFT active-matrix circuit. Referring to FIGS. 1A and 9, in an example illustrating a chiplet design with a routing solution suggested by the prior art, a conventional routing scheme for the electrical connections to a chiplet would require a significant display substrate area for the electrical connections and the separation between the electrical connections necessary to avoid electrical shorts in a realistic manufacturing process. As illustrated in FIG. 1A, pixels 30 and 30A are connected to a chiplet 20 through connection pads 24 and electrical connectors 34 and vias 80. Signal buss 32 connects an external controller (not shown) to the chiplet 20. A distance D separates pixel 30A from the chiplet 20, necessary to provide space to route the electrical connection to pixel 30. As shown in FIG. 9, a distance D separates the electrodes 12A, 12B, and 12C from the chiplet 20. The distance D is necessary to provide adequate space in the display area to route the electrical connections 34 from the eight connection pads 24 to the transparent electrodes 12A, 12B, 12C, connected through vias 80, and to the remaining transparent electrodes (not shown) and reduces the light-emitting area on the substrate. Other buss signals 32 necessary for controlling the chiplet 20 connect to the chiplet 20 through connection pads 24 and also reduce the area on the substrate available for light emission.

Figure 1A:
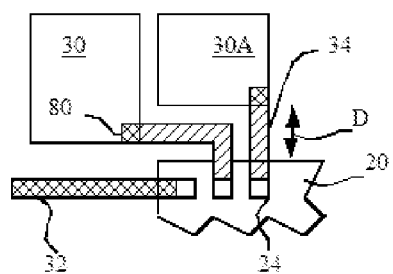
FIG. 1A is a plan view of a portion of a display device having a chiplet and employing routed electrical connectors in a design suggested by the prior art.
Figure 4:
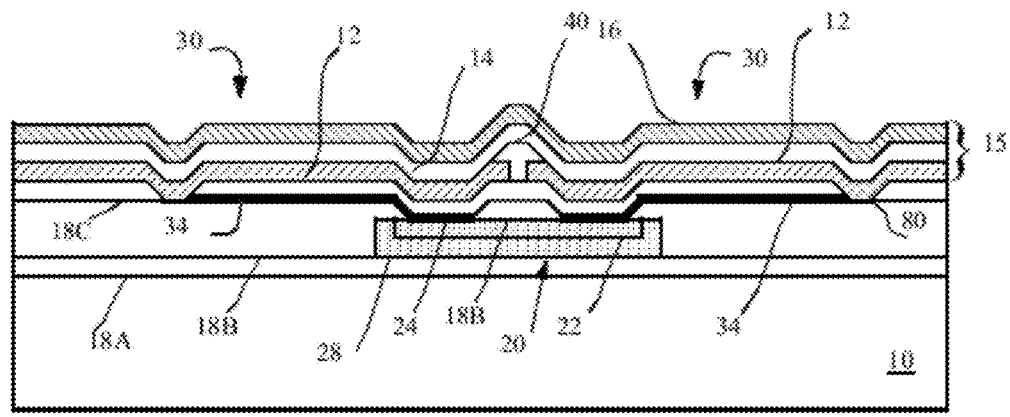
FIG. 4 is a cross section of a chiplet adhered to a substrate beneath an OLED structure according to an embodiment of the present invention.

Referring to schematic FIG. 1 and cross section FIG. 4, in one embodiment of the present invention, a display device comprises a transparent substrate 10 having a display area 11 (FIG. 1). A plurality of transparent electrodes 12 are formed over the transparent substrate 10 in the display area 11, one or more light-emitting layers 14 are formed over the transparent electrodes 12, and one or more reflective electrodes 16 are formed over the one or more light-emitting layers 14 (FIG. 4). The overlap between the plurality of transparent electrodes 12 and the one or more reflective electrodes 16 define a corresponding plurality of light-emitting pixels 30.

One or more chiplets 20 including pixel driving circuits 22 are connected to pixel connection pads 24, each pixel connection pad 24 electrically connected to a transparent electrode 12 by an electrically conductive opaque electrode connector 34, the pixel driving circuits 22 providing current through the connection pads 24 and the electrically conductive opaque electrode connectors 34 to the transparent electrodes 12 to drive the pixels 30 to emit light. The opaque electrode connectors 34 are formed over the transparent substrate 10 in the display area 11 and the transparent electrodes 12 are formed over, and separated from, the opaque electrical connectors by a transparent insulator 18C. Referring to FIG. 1, at least a portion of one opaque electrode connector 34A is electrically connected through via 80A to the transparent electrode corresponding to pixel 30B. The opaque electrode connector 34A overlaps at least a portion of a transparent electrode to which the opaque electrode connector 34A is not electrically connected, e.g. the transparent electrode corresponding to pixel 30A. By overlapping a portion of a light-emitting pixel area, an opaque electrode connector 34 obscures the light-emitting pixel in the overlapped area, forming a dark line, for example, but can also increase the total light-emissive area of a pixel. Pixel electrode connectors 34 can be made of metal, for example aluminum, silver, magnesium, or alloys of these or other metals and formed using conventional photolithographic processes.

Referring in more detail to FIG. 4, a chiplet 20 having a chiplet substrate 28 separate from the display substrate 10 is adhered to the substrate 10 with adhesion layer 18A, and buried with adhesion layer 18B. The chiplet 20 includes circuitry 22 for driving one or more pixels 30. Transparent electrodes 12 are electrically connected through vias 80 in planarizing, adhesive, and insulating layer 18C to opaque electrical connectors 34 and connection pads 24 formed on the chiplet 20. The transparent electrode 12 is separated and electrically insulated from the opaque electrical connectors 34 by layer 18C. One or more layers of light-emitting material 14 are located over the transparent electrodes 12 and reflective electrode 16 is formed over the layers of light-emitting material 14. The layer(s) of light-emitting material 14 can include multiple layers of light-emitting material as well as various charge-control layers as are known in the organic and inorganic light-emitting diode art. The electrodes 12, 16 and layer(s) of light-emitting material 14 form a light-emitting diode 15. Distinct light-emitting diodes 15 are separated by insulators 40.

The chiplets 20 can be located between the transparent electrode 12 and the substrate 10 in the display area. Furthermore, the transparent electrodes 12 can extend over the substrate 10 in a portion of the same display area as the chiplets 20, so that the transparent electrodes 12 overlap the chiplets 20 and the chiplets 20 obscure light emitted by the pixel 30.

The present invention increases the area available for light emission by pixels by extending the pixels over electrical connectors electrically connecting connection pads on chiplets to the transparent electrodes of the pixels. Since this is most useful when the chiplet connection pads are concentrated in a small area, so that electrical connections to the connection pads occupy significant display area with conventional routing designs, the present invention provides a significant advantage when the chiplet drives a large number of pixels and thus has a large number of connection pads. Therefore, according to an embodiment of the present invention, a chiplet can drive more than four pixels (e.g. eight pixels as shown in FIG. 1).

Figure 11A:
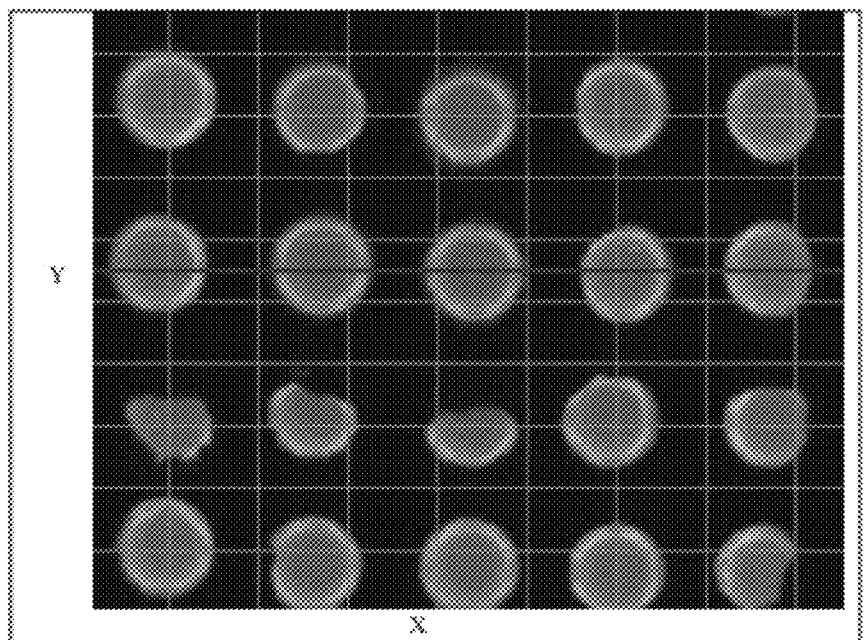
FIG. 11A is an image of an OLED device with a mask having holes useful in understanding the present invention.
Figure 11B:
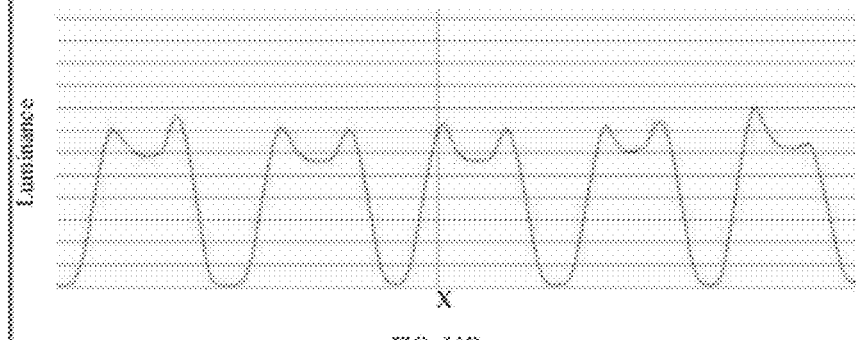
FIG. 11B is graph of the OLED luminance taken along the line shown in FIG. 11A.

Referring to FIG. 1A, an alternative layout employing chiplets, as in the invention, but with a conventional layout as suggested by prior-art display designs does not overlap opaque electrode connectors 34 within the light-emitting area. A careful comparison of FIG. 1A with a comparable portion of FIG. 1 shows that the actual light emitting area of pixel 30A in the invention of FIG. 1 is nearly 20% larger than the light-emitting area of pixel 30A in FIG. 1A. Furthermore, referring to FIGS. 11A and 11B, studies by Applicant show that light emitted toward the opaque electrode connectors 34 can be reflected first from the opaque electrode connectors toward the reflective electrode 16 and then out of the device. In FIG. 11A, an OLED device is located behind a metal mask having a reflective side oriented toward the OLED device opposite a light-absorbing side, with 0.5 mm holes in the mask. A halo of light is seen around the periphery of the holes, visually demonstrating that some of the light emitted behind the mask can be emitted through the holes. FIG. 11B is a graph of the luminance taken across the holes in FIG. 11A along the line marked Y and shows the increase in luminance around the periphery of the holes. Hence, this demonstrates that at least some light from the obscured light-emissive area is emitted from the device. Therefore, in a further embodiment of the present invention, the side of the opaque electrode connectors facing the transparent electrode can be reflective.

Figure 5:
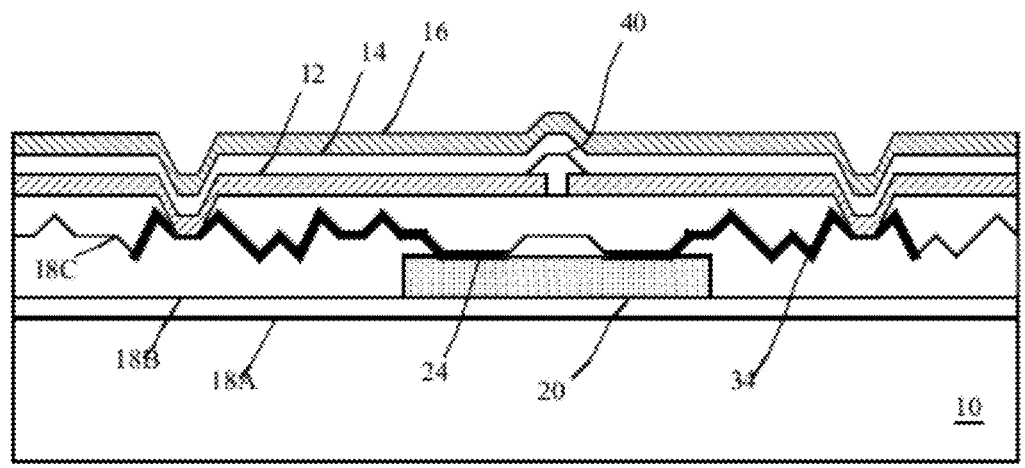
FIG. 5 is a cross section of a chiplet adhered to a substrate beneath an OLED structure with a diffusive and reflective lower electrode according to an embodiment of the present invention.

As is known in the OLED art, light emitted from the relatively high optical index light-emissive layer 14 can be trapped in the layer or in adjacent layers (e.g. adhesive layer 18). To extract trapped light from the device, the side of the opaque electrode connectors facing the transparent electrode can be light scattering, as shown in FIG. 5. It is also useful for displays to absorb ambient light, thereby improving the ambient contrast of the display, as for example, demonstrated in FIG. 11A. To improve the display ambient contrast, therefore, in one embodiment of the present invention, the side of the opaque electrode connectors opposite the transparent electrode can be light absorptive. For example, the opaque electrode connector can be made of metal treated so that the surface is black as is known in the art.

Figure 6:
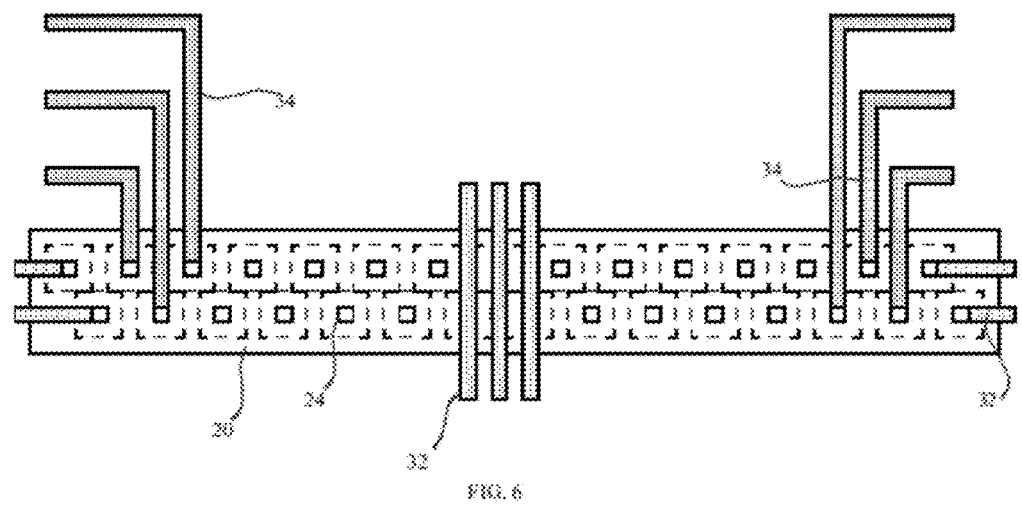
FIG. 6 is a plan view of a portion of a display device employing a chiplet with two rows of connection pads according to an embodiment of the present invention.
Figure 7:
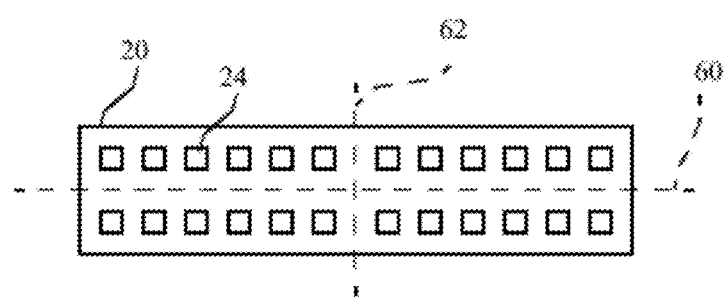
FIG. 7 is a plan view of a chiplet with two rows of connection pads and long and short axes according to an embodiment of the present invention.

In another embodiment of the present invention, the chiplet connection pads are located in one or more rows along a long axis of the chiplet. This configuration has the useful feature of increasing the number of connection pads in a chiplet relative to the circuitry in the chiplet. Since the circuits in crystalline silicon can be very small relative to the connection pads, it can be the case that the size of a chiplet is limited by the pad size and number, not by the quantity of circuitry, and therefore increasing the perimeter of the chiplet relative to a chiplet's area can be useful. Referring to FIG. 7, a chiplet 20 with a long axis 60 and short axis 62 has two rows of connection pads 24. While such a configuration increases the connectivity of the chiplet 20, as illustrated in FIG. 6, it also increases the problems of prior-art routing designs (e.g. FIGS. 1A, 9). As shown in FIG. 6, signal busses 32 are connected at either end of a chiplet 20 and at the center, to connection pads 24. The signal busses can be clock, data, select, power, ground, or other desired signals for operating the display. Electrode connections 34 are connected to connection pads 24 between the ends and the center connection pads. Hence, in a useful embodiment of the present invention, the extent of the connection pads 24 in the direction of the long axis is less than the extent of the pixels to which the same connection pads 24 are connected in the long axis direction. Referring back to FIG. 1, the length L1 is the extent of the connection pads 24 driving the pixels 30A and 30B in the direction of the long axis of the chiplets 20. The length L2 is the extent of the pixels 30A and 30B. L1 is less than L2.

Figure 2:
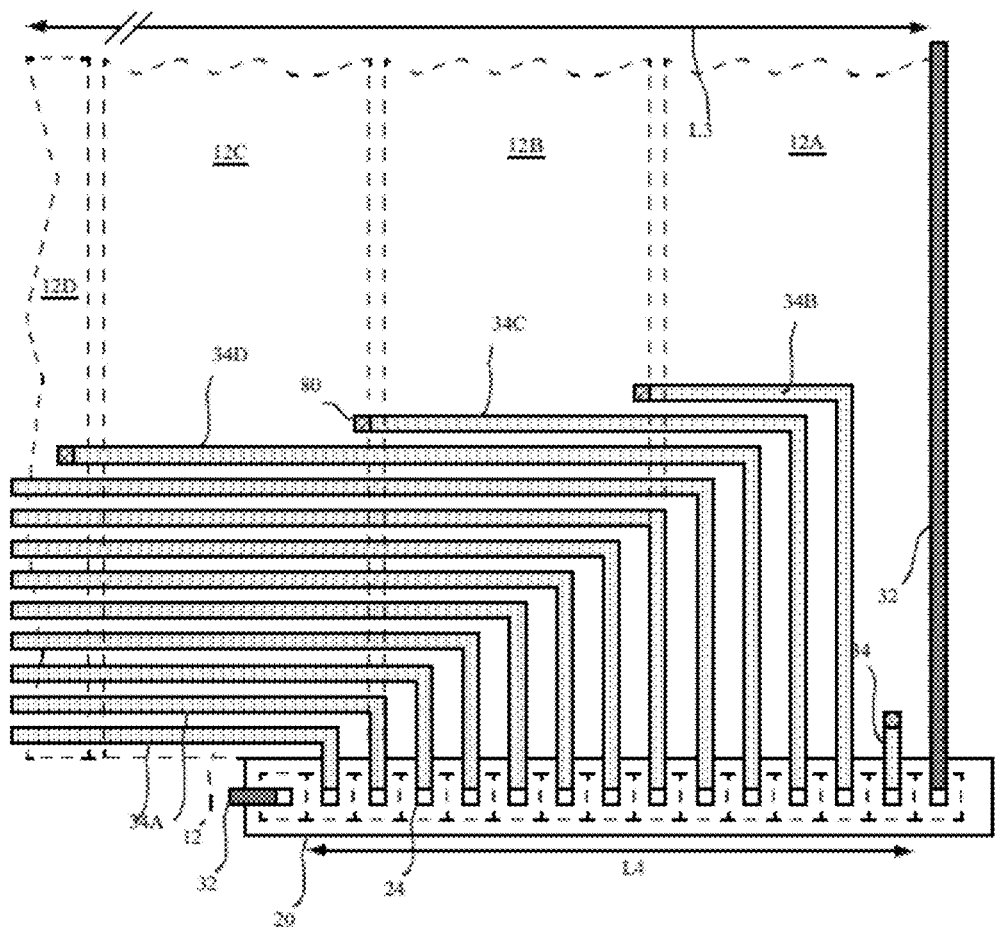
FIG. 2 is a plan view of a portion of a display device employing a chiplet with row and column electrodes according to an embodiment of the present invention.

The embodiment of the present invention illustrated in FIG. 1 can employ a conventional active-matrix control circuit in which each of the transparent electrodes is controlled by a separate circuit. In an alternative passive-matrix embodiment of the present invention, the transparent electrodes are formed into columns and the reflective electrodes are formed into rows (or vice versa); the overlap of the column electrodes and the row electrodes form pixels. As shown in FIG. 2, the transparent electrodes 12A 12B, 12C, 12D are formed into columns connected with electrical connections 34 to connection pads 24 on chiplets 20. In this figure, the electrical connections 34A-34D overlap at least a portion of a transparent electrode to which the opaque electrode connector is not electrically connected. For example, electrical connector 34B overlaps a portion of transparent electrode 12A and is electrically connected to transparent electrode 12B through via 80 and not to transparent electrode 12A. Electrical connector 34C overlaps a portion of transparent electrode 12A and a portion of electrode 12B and is electrically connected to transparent electrode 12C through via 80, and not to transparent electrodes 12A, 12B. Similarly, electrical connector 34D overlaps portions of transparent electrodes 12A, 12B, and 12C and is electrically connected to transparent electrode 12D through via 80, and not to transparent electrodes 12A, 12B, 12C. In this embodiment, the length L4 is the extent of the connection pads 24 driving the transparent column electrodes in the direction of the long axis of the chiplets 20. The length L3 is the extent of the transparent column electrodes (only transparent column electrodes 12A-12D are shown). L4 is less than L3.

Signal busses 32 connected to connection pads in the chiplet 20 provide control, power, and ground signals. For clarity, the row electrodes 16 are not shown in FIG. 2.

Figure 3:
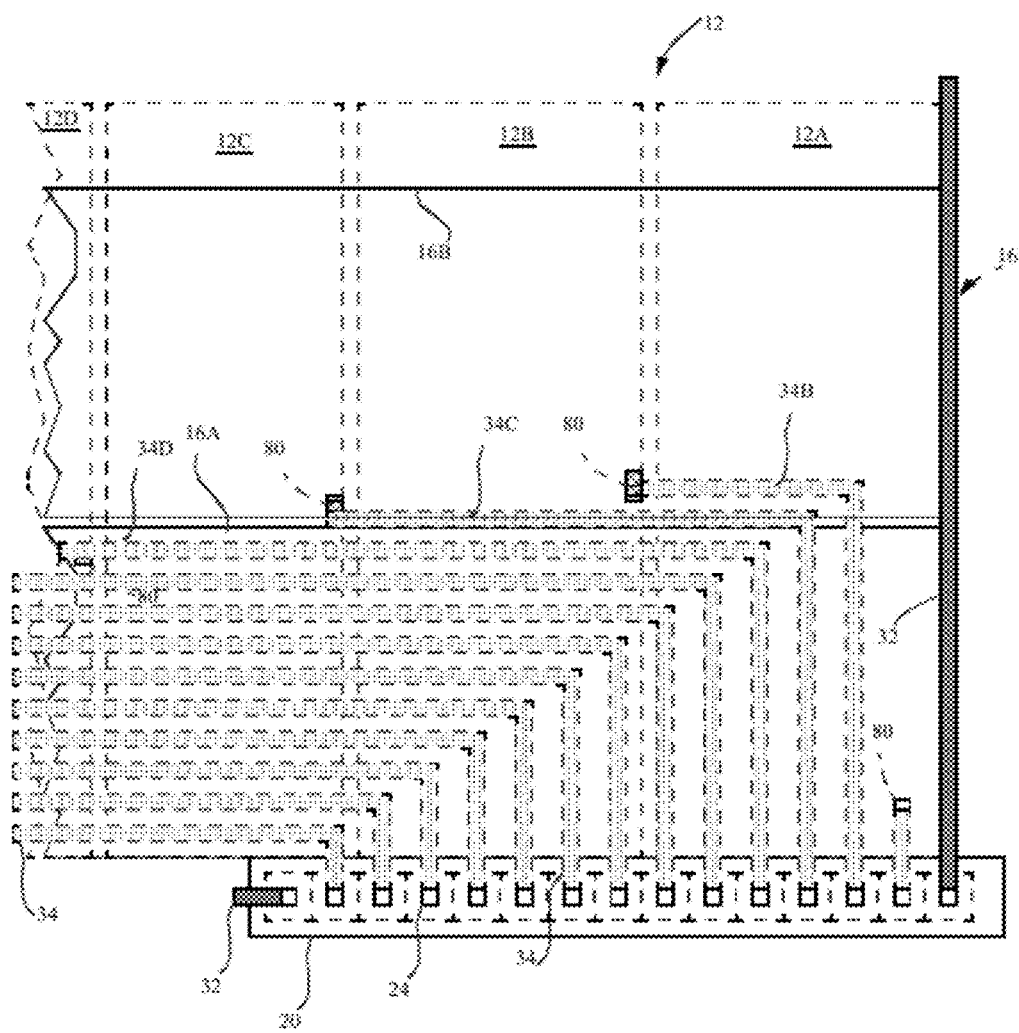
FIG. 3 is an alternative plan view of a portion of a display device employing a chiplet with row and column electrodes according to an embodiment of the present invention.

Referring to FIG. 3, row electrodes 16A and 16B are shown in a top view. In this embodiment, the reflective row electrodes 16 are orthogonal to the transparent column electrodes 12. Vias 80 connect the electrical connections 34 to the connection pads 24 on the chiplet 20. A first chiplet 20 can provide independent column signals to drive the column electrodes 12 while a second chiplet 20 (not shown) can provide the row signals to drive the row electrodes 16. Alternatively, a single chiplet can provide signals that drive both reflective row and transparent column electrodes 16, 12. The designations 'row' and 'column' are arbitrary and can be exchanged. Likewise, the choice of transparent or reflective electrode can be exchanged as long as the transparent electrode 12 is between the reflective electrode 16 and the electrical connections 34.

The present invention is directed to the relative locations of the electrical connections and the transparent electrodes over a display area on a substrate in a chiplet-based display device. In a further embodiment of the present invention having row and column electrodes, shown in FIGS. 2 and 8, at least one chiplet 20 can be located under (closer to the substrate) or adjacent to a first column electrode 12A connected to a first connection pad 24 on the at least one chiplet 20 by a first opaque electrode connector 34 and a second opaque electrode 34B can be connected to a second connection pad 24 on the at least one chiplet 20 and to a second column electrode 12B different from the first column electrode 12A. In this embodiment, the second opaque electrode connector 34B passes under the first column electrode 12A. In a further embodiment illustrated in FIG. 3, the second opaque electrode connector 34B passes under the first column electrode 12A and under a first row electrode 16A and under at least a portion of a second row electrode 16B adjacent to the first row electrode 16A. In this position, the second opaque electrode connector 34B can be connected to the second column electrode 12B under the second row electrode 16B. As shown in FIG. 3, this structure can be extended to other electrode connectors, for example a third opaque electrode 34C can be connected to a third connection pad 24 on the at least one chiplet 20 and to a third column electrode 12C different from the first and second column electrodes 12A, 12B. Furthermore, the third opaque electrode connector 34C passes under the first column electrode 12A and under the second column electrode 12B. The third opaque electrode connector 34C also passes under a first row electrode 16A and under a second row electrode 16B adjacent to the first row electrode 16A.

Figure 8:
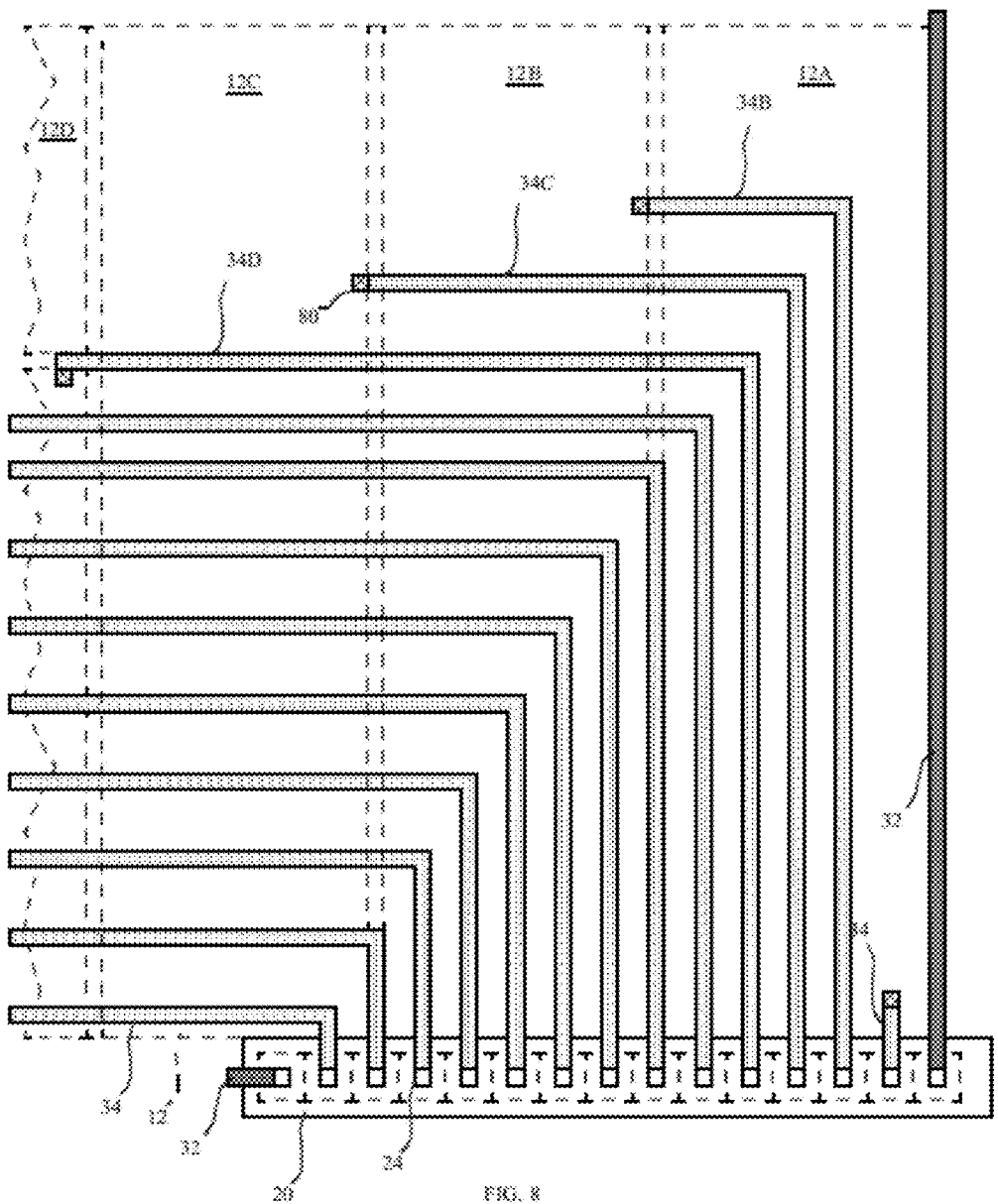
FIG. 8 is a plan view of a portion of a display device employing a chiplet with row and column electrodes according to an alternative embodiment of the present invention.

The present invention can increase the emissive area available to a display device. By routing electrode connectors under emissive areas, however, a portion of the light-emitting area of a pixel is obscured. In general, the obscured areas will be too small to be resolved by a human eye, since pixels themselves (particularly if they are part of a multi-color pixel group) are typically not resolved by a viewer at a desired viewing distance. Nonetheless, the obscured areas within a pixel, when combined with spacing between pixels, for example space necessary for locating chiplets or routing signal busses can increase the overall darkened area so that a viewer might perceive the aggregate darker area. Hence, according to an embodiment of the present invention, larger distances, as shown in FIG. 8, can separate the electrode connections 34, compared to FIG. 2. In the example of FIG. 8, the electrode connections 34B-34D connected to connection pads 24 extend a greater distance along the length of the column electrodes 12A-12D, thereby providing more emissive area closer to the chiplet 20 and reducing the concentration of obscured pixel areas close to the chiplet 20 and signal busses 32.

Figure 10:
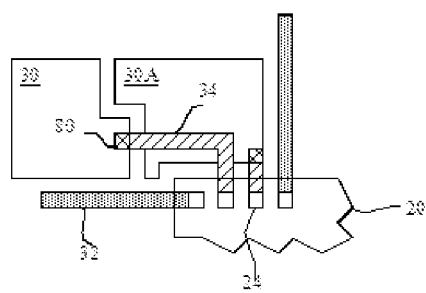
FIG. 10 is a plan view of a portion of a display device employing a chiplet and having pixels with emitting areas of equal size according to an alternative embodiment of the present invention.

It is still the cases that, in the embodiments of the present invention shown in FIGS. 2, 3, and 8, the transparent column electrodes have differing amounts of obscured area. Typically, those electrodes that are furthest from the end of the chiplet will have the greatest amount of area obscured by the electrode connections. Hence, the pixels employing these transparent electrodes can appear to be relatively dimmer. To compensate, the relatively dimmer pixels can be driven with more current, but this solution reduces the lifetime of the dimmer pixels. In an alternative embodiment of the present invention, at least two transparent electrodes can have different areas. The electrode area can be adjusted so that the emissive area is the same or so that the amount of light emitted from the pixels is the same, when driven by the same signal. For example, FIG. 10 depicts an embodiment of the present invention wherein the non-obscured emissive areas of pixels 30 and 30A, driven by electrode connectors 34 from connection pads 24 on chiplet 20 with signal busses 32, are equal while the transparent electrode areas are different. This structure can also be employed in an arrangement of row and column electrodes by making the column or row electrodes, or both, that have more obscured area larger, thus creating at least one pixel that has an area different from any of the other pixels in the same row or at least one pixel that has an area different from any of the other pixels in the same column. The area of the at least one pixel can be adjusted relative to the area of any of the pixels obscured by the opaque electrodes in order to match either the lifetime or luminance of the pixels so they are equivalent.

It is an advantage of the present invention that the signal busses can be simpler to route and formed in a single, common layer. Such a common layer reduces manufacturing steps. According to various embodiments of the present invention, other busses can be formed in the display area. A pass-through buss is a buss formed over the substrate that connects to a first connection pad on a chiplet, passes through the chiplet to a second connection pad, and then is reconnected to a buss line formed over the substrate. Hence, a pass-through buss includes a series of buss segments, connection pads, and chiplet connections forming an electrically continuous buss having different segments. Pass-through busses allow busses to extend across the display area in a direction orthogonal to other busses. The pass-through busses also enable an electrical connection to all of the chiplets; that is, the pass-through busses can electrically connect every chiplet to a common signal.

An external controller (not shown) provides signals on the signal busses to the chiplets. The chiplets include circuitry to provide current to the transparent electrodes and can provide current to the reflective electrode(s), if desired (for example in a row/column electrode configuration). Current flows through light-emitting material formed between the row and column electrodes causing the light-emitting material to emit light. In an embodiment of the present invention, the row and column electrodes can be formed in separate layers and pixels can have passive-matrix control controlled by row driver and column driver chiplets. The pixels formed by the overlap of the row and column electrodes can be divided into pixel groups controlled by separate column driver chiplets. Row driver chiplets can be shared, as can row electrodes, between pixel groups. Alternatively, each pixel can be controlled by a single chiplet with an electrical connection to the transparent electrode while the reflective electrode is electrically connected in common to all of the pixels.

The chiplets can be connected to an external controller through a buss or through multiple busses. The buss can be a serial, parallel, or point-to-point buss and can be digital or analog. A buss is connected to the chiplets to provide signals, such as power, ground, data, or select signals. More than one buss separately connected to one or more controllers can be employed. The busses can supply a variety of signals, including timing (e.g. clock) signals, data signals, select signals, power connections, or ground connections. The signals can be analog or digital, for example digital addresses or data values. Analog data values can be supplied as charge. The storage registers can be digital (for example comprising flip-flops) or analog (for example comprising capacitors for storing charge).

In operation, a controller receives and processes an information signal according to the needs of the display device and transmits the processed signal and control information through one or more busses to each chiplet in the device. The processed signal includes luminance information for each light-emitting pixel element corresponding to the associated chiplets for each pixel. The luminance information can be stored in an analog or digital storage element corresponding to each light-emitting pixel element. The chiplets then drive current corresponding to the luminance information through the pixels to emit light.

The controller can be implemented as a chiplet and affixed to the substrate. The controller can be located on the periphery of the substrate, or can be external to the substrate and comprise a conventional integrated circuit.

According to various embodiments of the present invention, the chiplets can be constructed in a variety of ways; for example, with one or two rows of connection pads along a long dimension of a chiplet. Interconnection busses and wires can be formed from various materials and can be deposited on the device substrate using various methods. For example, interconnection busses and wires can be metal, either evaporated or sputtered, for example aluminum or aluminum alloys. Alternatively, the interconnection busses and wires can be made of cured conductive inks or metal oxides. In one cost-advantaged embodiment, the interconnection busses and wires are formed in a single layer.

The present invention is particularly useful for multi-pixel device embodiments employing a large device substrate, e.g. glass, plastic, or foil, with a plurality of chiplets arranged in a regular arrangement over the device substrate. Each chiplet can control a plurality of pixels formed over the device substrate according to the circuitry in the chiplet and in response to control signals from an external controller. Individual pixel groups or multiple pixel groups can be located on tiled elements, which can be assembled to form the entire display.

According to the present invention, chiplets provide distributed pixel control elements over a substrate. A chiplet is a relatively small integrated circuit compared to the device substrate and includes a circuit including wires, connection pads, passive components such as resistors or capacitors, or active components such as transistors or diodes, formed on an independent substrate. Chiplets are separately manufactured from the display substrate and then applied to the display substrate. Details of these processes can be found, for example, in U.S. Pat. No. 6,879,098; U.S. Pat. No. 7,557,367; U.S. Pat. No. 7,622,367; US20070032089; US20090199960 and US20100123268.

The chiplets are preferably manufactured using silicon or silicon on insulator (SOI) wafers using known processes for fabricating semiconductor devices. Each chiplet is then separated prior to attachment to the device substrate. The crystalline base of each chiplet can therefore be considered a substrate separate from the device substrate and over which the chiplet circuitry is disposed. The plurality of chiplets therefore has a corresponding plurality of substrates separate from the device substrate and each other. In particular, the independent substrates are separate from the substrate on which the pixels are formed and the areas of the independent, chiplet substrates, taken together, are smaller than the area of the device substrate. Chiplets can have a crystalline substrate to provide higher performance active components than are found in, for example, thin-film amorphous or polycrystalline silicon devices. Chiplets can have a thickness preferably of 100 um or less, and more preferably 20 um or less. This facilitates formation of the adhesive and planarization material over the chiplet that can then be applied using conventional spin-coating techniques. According to one embodiment of the present invention, chiplets formed on crystalline silicon substrates are arranged in a geometric array and adhered to a device substrate with adhesion or planarization materials. Connection pads on the surface of the chiplets are employed to connect each chiplet to signal wires, power busses and row or column electrodes to drive pixels. Chiplets can control at least four pixels.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet, however, also requires connection pads for making electrical connection to the wiring layer provided over the chiplets once assembled onto the display substrate. The connection pads must be sized based on the feature size of the lithography tools used on the display substrate (for example 5 um) and the alignment of the chiplets to the wiring layer (for example +/−5 um). Therefore, the connection pads can be, for example, 15 um wide with 5 um spaces between the pads. This means that the pads will generally be significantly larger than the transistor circuitry formed in the chiplet.

The connection pads can generally be formed in a metallization layer on the chiplet over the transistors. It is desirable to make the chiplet with as small a surface area as possible to enable a low manufacturing cost.

By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but also much smaller active elements (e.g. transistors), the circuitry size is much reduced. A useful chiplet can also be formed using micro-electromechanical (MEMS) structures, for example as described in "A novel use of MEMs switches in driving AMOLED", by Yoon, Lee, Yang, and hug, Digest of Technical Papers of the Society for Information Display, 2008, 3.4, p. 13.

The device substrate can comprise glass and the wiring layers made of evaporated or sputtered metal or metal alloys, e.g. aluminum or silver, formed over a planarization layer (e.g. resin) patterned with photolithographic techniques known in the art. The chiplets can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292 and U.S. Pat. No. 5,061,569. Inorganic devices, for example, employing quantum dots formed in a polycrystalline semiconductor matrix (for example, as taught in US20070057263), and employing organic or inorganic charge-control layers, or hybrid organic/inorganic devices can be employed. Many combinations and variations of organic or inorganic light-emitting displays can be used to fabricate such a device, including active-matrix displays having either top- or bottom-emitter architectures.

The invention has been described in detail with particular reference to certain preferred embodiments thereof, but it should be understood that variations and modifications could be effected within the spirit and scope of the invention.

The invention claimed is:

1. A display device, comprising:
   a) a transparent substrate having a display area;
   b) a plurality of transparent electrodes formed over the transparent substrate in the display area, one or more light-emitting layers formed over the transparent electrodes, one or more reflective electrodes formed over the one or more light-emitting layers, where an overlap between the plurality of transparent electrodes and the one or more reflective electrodes defines a corresponding plurality of light-emitting pixels;
   c) one or more chiplets including pixel driving circuits connected to pixel connection pads, each pixel connection pad electrically connected to a transparent electrode by an electrically conductive opaque electrode connector, the pixel driving circuits providing current through the connection pads and the electrically conductive opaque electrode connectors to the transparent electrodes to drive the pixels to emit light; and
   d) wherein the electrically conductive opaque electrode connectors are formed over the transparent substrate in the display area and the transparent electrodes are formed over, and separated from, the electrically conductive opaque electrode connectors by a transparent insulator and wherein at least a portion of one electrically conductive opaque electrode connector overlaps at least a portion of a transparent electrode to which the electrically conductive opaque electrode connector is not electrically connected.

2. The display device of claim 1, wherein a chiplet drives more than four pixels.

3. The display device of claim 1, wherein the chiplets are located between the transparent electrodes and the substrate in the display area and wherein the transparent electrodes extend over the substrate in a portion of the same display area as the chiplets.

4. The display device of claim 1, wherein the side of the electrically conductive opaque electrode connectors facing the transparent electrode is reflective.

5. The display device of claim 1, wherein the side of the electrically conductive opaque electrode connectors facing the transparent electrode is light-scattering.

6. The display device of claim 1, wherein the side of the electrically conductive opaque electrode connectors opposite the transparent electrode is light absorptive.

7. The display device of claim 1, wherein the connection pads are located in one or more rows along a long axis of the chiplet.

8. The display device of claim 7, wherein the extent of the connection pads in the direction of the long axis is less than the extent of the pixels to which the chiplet is connected in the axis direction.

9. The display device of claim 1, wherein the transparent electrodes are column electrodes formed in columns in a column direction and the reflective electrode includes a plurality of row electrodes formed in rows in a row direction different from the column direction, and the pixels are defined by the overlap of the column electrodes and the row electrodes.

10. The display device of claim 9, wherein at least one chiplet is located under or adjacent to a first column electrode connected to a first connection pad on the at least one chiplet by a first electrically conductive opaque electrode connector and a second electrically conductive opaque electrode is connected to a second connection pad on the at least one chiplet and to a second column electrode different from the first column electrode.

11. The display device of claim 10, wherein the second electrically conductive opaque electrode connector passes under the first column electrode.

12. The display device of claim 11, wherein the second electrically conductive opaque electrode connector passes under the first column electrode and under a first row electrode and under at least a portion of a second row electrode adjacent to the first row electrode.

13. The display device of claim 12, wherein the second electrically conductive opaque electrode connector is connected to the second column electrode under the second row electrode.

14. The display device of claim 10, further comprising a third electrically conductive opaque electrode connected to a third connection pad on the at least one chiplet and to a third column electrode different from the first and second column electrodes.

15. The display device of claim 14, wherein the third opaque electrically conductive electrode connector passes under the first column electrode and under the second column electrode.

16. The display device of claim 15, wherein the third opaque electrically conductive electrode connector passes under a first row electrode and under a second row electrode adjacent to the first row electrode.

17. The display device of claim 1, wherein at least two transparent electrodes have different areas.

18. The display device of claim 9, wherein at least two row or two column electrodes have different areas.

19. The display device of claim 9, wherein at least one pixel has an area different from any of the other pixels that are obscured by the opaque electrodes and located in the same row or wherein at least one pixel has an area different from any of the other pixels that are obscured by the opaque electrodes and located in the same column.

20. The display device of claim 19, wherein either the lifetime or luminance of the at least one pixel and the pixels obscured by the opaque electrodes are equivalent.

* * * * *